United States Patent
Hsu et al.

(10) Patent No.: US 9,564,462 B2
(45) Date of Patent: Feb. 7, 2017

(54) IMAGE-SENSOR STRUCTURES

(71) Applicant: VisEra Technologies Company Limited, Hsin-Chu (TW)

(72) Inventors: Chung-Jung Hsu, Hsinchu (TW); Yu-Kun Hsiao, Hsinchu (TW); Chung-Hao Lin, Keelung (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 3 days.

(21) Appl. No.: 14/504,039

(22) Filed: Oct. 1, 2014

(65) Prior Publication Data
US 2016/0099270 A1 Apr. 7, 2016

(51) Int. Cl.
*H01L 27/146* (2006.01)

(52) U.S. Cl.
CPC ... *H01L 27/14621* (2013.01); *H01L 27/14627* (2013.01); *H01L 27/14645* (2013.01); *H01L 27/14685* (2013.01)

(58) Field of Classification Search
None
See application file for complete search history.

(56) References Cited

U.S. PATENT DOCUMENTS

| 5,294,288 A * | 3/1994 | Melpolder et al. ........ 427/163.1 |
| 2010/0261303 A1 * | 10/2010 | Ogata ............... H01L 27/14621 257/E31.127 |
| 2015/0048467 A1 * | 2/2015 | Weng et al. ................... 257/432 |

FOREIGN PATENT DOCUMENTS

| JP | 2004-26974 A | * | 1/2004 | ............ C08F 265/00 |
| JP | 2013115335 A | | 6/2013 | |
| JP | 2014142628 A | | 8/2014 | |
| TW | 201431970 A | | 8/2014 | |
| TW | 201436180 A | | 9/2014 | |
| WO | WO 2012073402 A1 | | 6/2012 | |

OTHER PUBLICATIONS

Machine translation of JP 2004-26974 A, publication date Jan. 29, 2004.*

* cited by examiner

*Primary Examiner* — Michelle Mandala
(74) *Attorney, Agent, or Firm* — Muncy, Geissler, Olds & Lowe, P.C.

(57) ABSTRACT

An image-sensor structure is provided. The image-sensor structure includes a substrate, a plurality of photoelectric conversion units formed in the substrate, and a plurality of color filter patterns including a red filter pattern having a first refractive index, a green filter pattern having a second refractive index and a blue filter pattern having a third refractive index formed above the substrate and the photoelectric conversion units, wherein at least one color filter pattern contains a component having a specific refractive index such that the second refractive index of the green filter pattern is higher than the first refractive index of the red filter pattern and the third refractive index of the blue filter pattern.

15 Claims, 5 Drawing Sheets

IMAGE-SENSOR STRUCTURES

BACKGROUND OF THE INVENTION

Field of the Invention

The invention relates to an image-sensor structure, and more particularly to an image-sensor structure with color filter patterns containing high/low-refractive-index components.

Description of the Related Art

An image sensor, as a kind of semiconductor device, transforms optical images into electrical signals. Image sensors can be generally classified into charge coupled devices (CCDs) and complementary metal oxide semiconductor (CMOS) image sensors. Among these image sensors, a CMOS image sensor comprises a photodiode for detecting incident light and transforming it into electrical signals, and logic circuits for transmitting and processing the electrical signals.

In an image sensor, in order to increase sensitivity of a color filter material, an appropriate color filter material is selected to fit the expected target spectrum of the color filters. However, device performance such as SNR (signal-to-noise ratio) or quantum efficiency (QE) cannot achieve optimization only by fitting the expected target spectrum of the color filters due to the interaction between the color filter materials.

Therefore, development of novel color filters with an adjustable refractive index (which considers the issue of the interaction between the color filter materials) which can improve device performance such as SNR (signal-to-noise ratio) or quantum efficiency (QE) is desirable.

BRIEF SUMMARY OF THE INVENTION

One embodiment of the invention provides an image-sensor structure comprising a substrate, a plurality of photoelectric conversion units formed in the substrate, and a plurality of color filter patterns comprising a red filter pattern having a first refractive index, a green filter pattern having a second refractive index and a blue filter pattern having a third refractive index formed above the substrate and the photoelectric conversion units, wherein at least one of the color filter patterns contains a component having a specific refractive index such that the second refractive index of the green filter pattern is higher than the first refractive index of the red filter pattern and the third refractive index of the blue filter pattern.

The photoelectric conversion unit comprises a photodiode.

Each of the plurality of color filter patterns comprise at least one kind of pigments and compounds. The compounds are one or more dispersant, acrylic resin, or sensitive polymer. Mixtures of at least one kind of pigments and compounds are capable of producing consistent, compatible and predictable color effects. The color filter patterns are obtained from various combinations of pigment and compound to form the red filter pattern, green filter pattern, and blue filter pattern, respectively. Each of the mixtures has a refractive index based on its composition and proportion. The composition stands for various combinations of pigment and compound, and the proportion means proper ratio between pigment and compound.

The component comprises sulfur-containing polymers, silane-containing polymers, aromatic polyesters, polyimides, titanium oxide-containing polymers, or a combination thereof, having the specific refractive index higher than 1.5.

The component comprises fluoroacrylic polymers, fluoroacrylic copolymers, or a combination thereof, having the specific refractive index lower than 1.5.

The component has 1-20 wt % based on the weight of the red filter pattern, the green filter pattern or the blue filter pattern.

The first refractive index of the red filter pattern ranges from 1.5 to 1.8, the second refractive index of the green filter pattern ranges from 1.6 to 1.9, and the third refractive index of the blue filter pattern ranges from 1.3 to 1.8.

In this embodiment, the blue filter pattern contains the component and the mixture, and the specific refractive index is lower than the refractive index of the mixture such that the second refractive index of the green filter pattern is higher than the first refractive index of the red filter pattern and the third refractive index of the blue filter pattern.

One embodiment of the invention provides an image-sensor structure comprising a substrate, a plurality of photoelectric conversion units formed in the substrate, and a plurality of color filter patterns comprising a red filter pattern having a first refractive index, a green filter pattern having a second refractive index and a blue filter pattern having a third refractive index formed above the substrate and the photoelectric conversion units, wherein at least one of the color filter patterns contains a component having a specific refractive index such that the second refractive index of the green filter pattern is higher than the first refractive index of the red filter pattern and the third refractive index of the blue filter pattern. In this embodiment, the green filter pattern contains the component and the mixture, and the specific refractive index is higher than the refractive index of the mixture, and the blue filter pattern contains the component and the mixture, and the specific refractive index is lower than the refractive index of the mixture such that the second refractive index of the green filter pattern is higher than the first refractive index of the red filter pattern and the third refractive index of the blue filter pattern.

One embodiment of the invention provides an image-sensor structure comprising a substrate, a plurality of photoelectric conversion units formed in the substrate, and a plurality of color filter patterns comprising a red filter pattern having a first refractive index, a green filter pattern having a second refractive index and a blue filter pattern having a third refractive index formed above the substrate and the photoelectric conversion units, wherein at least one of the color filter patterns contains a component having a specific refractive index such that the second refractive index of the green filter pattern is higher than the first refractive index of the red filter pattern and the third refractive index of the blue filter pattern. In this embodiment, the green filter pattern contains the component and the mixture, and the specific refractive index is higher than the refractive index of the mixture, the red filter pattern contains the component and the mixture, and the specific refractive index is higher than the refractive index of the mixture, and the blue filter pattern contains the component and the mixture, and the specific refractive index is lower than the refractive index of the mixture such that the second refractive index of the green filter pattern is higher than the first refractive index of the red filter pattern and the third refractive index of the blue filter pattern.

One embodiment of the invention provides an image-sensor structure comprising a substrate, a plurality of photoelectric conversion units formed in the substrate, and a plurality of color filter patterns comprising a red filter pattern having a first refractive index, a green filter pattern having a second refractive index and a blue filter pattern having a third refractive index formed above the substrate and the photoelectric conversion units, wherein at least one of the color filter patterns contains a component having a specific refractive index such that the second refractive index of the green filter pattern is higher than the first refractive index of the red filter pattern and the third refractive index of the blue filter pattern. In this embodiment, the green filter pattern contains the component and the mixture, and the specific refractive index is higher than the refractive index of the mixture such that the second refractive index of the green filter pattern is higher than the first refractive index of the red filter pattern and the third refractive index of the blue filter pattern.

One embodiment of the invention provides an image-sensor structure comprising a substrate, a plurality of photoelectric conversion units formed in the substrate, and a plurality of color filter patterns comprising a red filter pattern having a first refractive index, a green filter pattern having a second refractive index and a blue filter pattern having a third refractive index formed above the substrate and the photoelectric conversion units, wherein at least one of the color filter patterns contains a component having a specific refractive index such that the second refractive index of the green filter pattern is higher than the first refractive index of the red filter pattern and the third refractive index of the blue filter pattern. In this embodiment, the green filter pattern contains the component and the mixture, and the specific refractive index is higher than the refractive index of the mixture, and the red filter pattern contains the component and the mixture, and the specific refractive index is higher than the refractive index of the mixture such that the second refractive index of the green filter pattern is higher than the first refractive index of the red filter pattern and the third refractive index of the blue filter pattern.

The image-sensor structure further comprises a plurality of microlenses formed above the color filter patterns.

The invention adopts a color filter material, for example, a pigment, an acrylic resin or a sensitive polymer, blended with a high-refractive-index component, for example, sulfur-containing polymers, silane-containing polymers, aromatic polyesters, polyimides, titanium oxide-containing polymers, or a combination thereof, or a low-refractive-index component, for example, fluoroacrylic polymers, fluoroacrylic copolymers, or a combination thereof, to adjust the refractive index of the color filters such that the refractive index of the green filter is higher than the refractive index of the red filter and the refractive index of the blue filter. The SNR (signal-to-noise ratio) or quantum efficiency (QE) of the image-sensor structure with the color filters having various refractive indexes can thus be improved to achieve optimal device performance due to the green filter having the highest refractive index among the color filters which can increase the sensitivity of the green filter.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
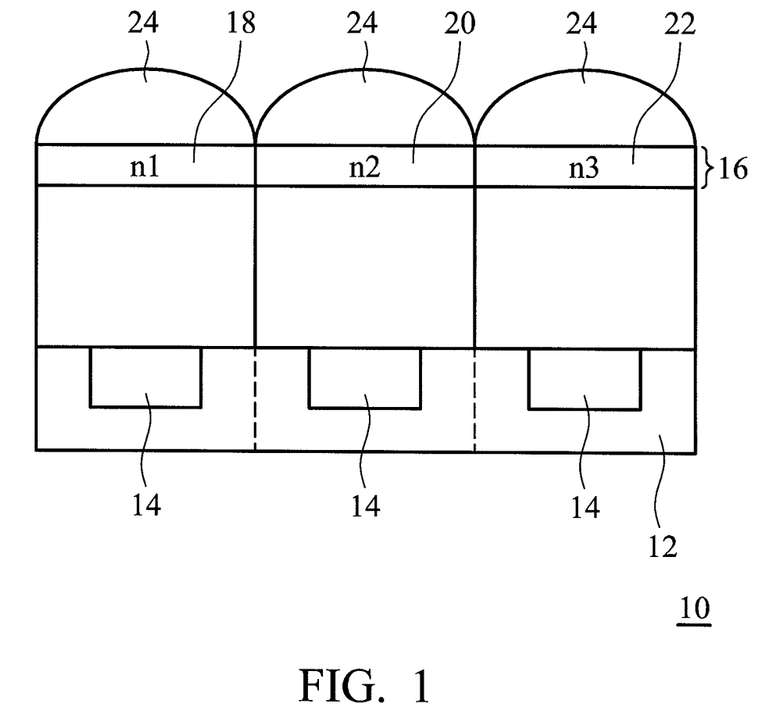
FIG. 1 is a cross-sectional view of an image-sensor structure in accordance with one embodiment of the invention.

An image-sensor structure according to one embodiment of the invention is described with reference to FIG. 1. FIG. 1 is a cross-sectional view of the image-sensor structure.

Referring to FIG. 1, an image-sensor structure 10 is provided. The image-sensor structure 10 comprises a substrate 12, a plurality of photoelectric conversion units 14 formed in the substrate 12, and a plurality of color filter patterns 16 comprising a red filter pattern 18 having a first refractive index n1, a green filter pattern 20 having a second refractive index n2 and a blue filter pattern 22 having a third refractive index n3 formed above the substrate 12 and the photoelectric conversion units 14. Specifically, a component having a specific refractive index has 1-10 wt % or 1-20 wt % based on the weight of at least one of the color filter patterns 16, for example, the red filter pattern 18, the green filter pattern 20 or the blue filter pattern 22 such that the second refractive index n2 of the green filter pattern 20 is higher than the first refractive index n1 of the red filter pattern 18 and the third refractive index n3 of the blue filter pattern 22.

In some embodiments, the photoelectric conversion unit 14 may comprise a photodiode (PD).

In some embodiments, each of the plurality of color filter patterns 16 may comprise at least one kind of pigments and compounds. The compounds may be one or more of dispersant, acrylic resin, sensitive polymer, etc. Mixtures of at least one kind of pigments and compounds are capable of producing consistent, compatible and predictable color effects. The color filter patterns 16 may be obtained from various combinations of pigment and compound to form the red filter pattern 18, the green filter pattern 20, and the blue filter pattern 22, respectively. Each of the mixtures has a refractive index based on its composition and proportion. The composition stands for various combinations of pigment and compound, and the proportion means proper ratio between pigment and compound.

In some embodiments, the component may comprise sulfur-containing polymers, silane-containing polymers, aromatic polyesters, polyimides, titanium oxide-containing polymers, or a combination thereof, having the specific refractive index higher than about 1.5.

In some embodiments, the component may comprise fluoroacrylic polymers, fluoroacrylic copolymers, or a combination thereof, having the specific refractive index lower than about 1.5.

In some embodiments, the first refractive index n1 of the red filter pattern 18 ranges from about 1.5 to about 1.8, the second refractive index n2 of the green filter pattern 20 ranges from about 1.6 to about 1.9, and the third refractive index n3 of the blue filter pattern 22 ranges from about 1.3 to about 1.8.

In this embodiment, the blue filter pattern 22 contains the component and the mixture, and the specific refractive index is lower than the refractive index of the mixture such that the second refractive index n2 of the green filter pattern 20 is higher than the first refractive index n1 of the red filter pattern 18 and the third refractive index n3 of the blue filter pattern 22. For example, the second refractive index n2 of the green filter pattern 20 is 1.6, the first refractive index n1 of the red filter pattern 18 is 1.5, and the third refractive index n3 of the blue filter pattern 22 is 1.3.

In some embodiments, the image-sensor structure 10 may further comprise a plurality of microlenses 24 formed above the color filter patterns 16.

Figure 2:
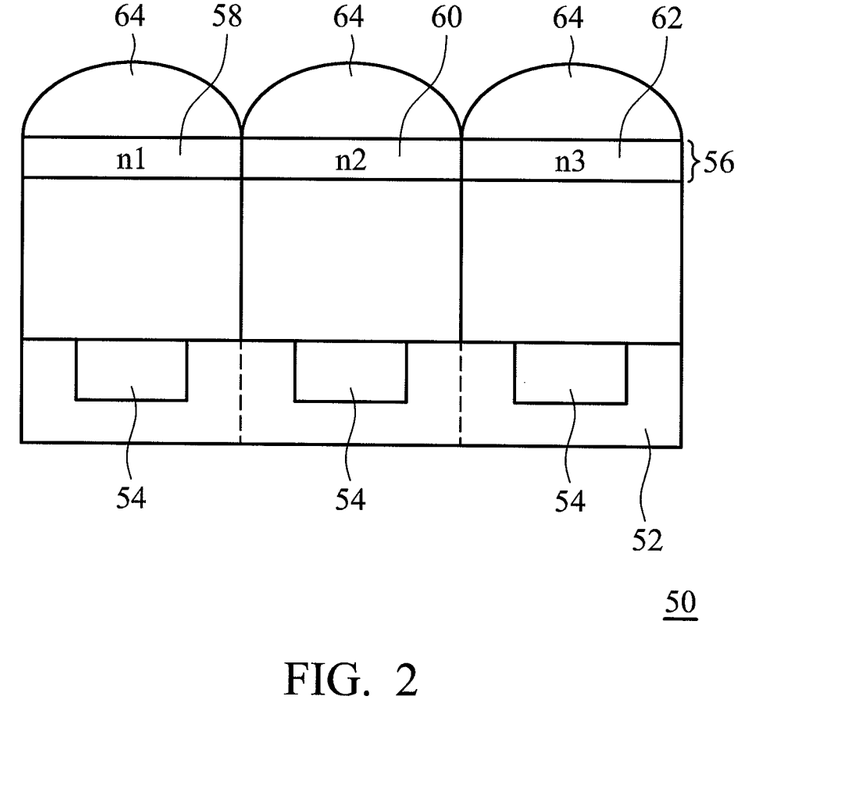
FIG. 2 is a cross-sectional view of an image-sensor structure in accordance with one embodiment of the invention.

An image-sensor structure according to one embodiment of the invention is described with reference to FIG. 2. FIG. 2 is a cross-sectional view of the image-sensor structure.

Referring to FIG. 2, an image-sensor structure 50 is provided. The image-sensor structure 50 comprises a substrate 52, a plurality of photoelectric conversion units 54 formed in the substrate 52, and a plurality of color filter patterns 56 comprising a red filter pattern 58 having a first refractive index n1, a green filter pattern 60 having a second refractive index n2 and a blue filter pattern 62 having a third refractive index n3 formed above the substrate 52 and the photoelectric conversion units 54. Specifically, a component having a specific refractive index has 1-10 wt % or 1-20 wt % based on the weight of at least one of the color filter patterns 56, for example, the red filter pattern 58, the green filter pattern 60 or the blue filter pattern 62 such that the second refractive index n2 of the green filter pattern 60 is higher than the first refractive index n1 of the red filter pattern 58 and the third refractive index n3 of the blue filter pattern 62.

In some embodiments, the photoelectric conversion unit 54 may comprise a photodiode (PD).

In some embodiments, each of the plurality of color filter patterns 56 may comprise at least one kind of pigments and compounds. The compounds may be one or more of dispersant, acrylic resin, sensitive polymer, etc. Mixtures of at least one kind of pigments and compounds are capable of producing consistent, compatible and predictable color effects. The color filter patterns 56 may be obtained from various combinations of pigment and compound to form the red filter pattern 58, the green filter pattern 60, and the blue filter pattern 62, respectively. Each of the mixtures has a refractive index based on its composition and proportion. The composition stands for various combinations of pigment and compound, and the proportion means proper ratio between pigment and compound.

In some embodiments, the component may comprise sulfur-containing polymers, silane-containing polymers, aromatic polyesters, polyimides, titanium oxide-containing polymers, or a combination thereof, having the specific refractive index higher than about 1.5.

In some embodiments, the component may comprise fluoroacrylic polymers, fluoroacrylic copolymers, or a combination thereof, having the specific refractive index lower than about 1.5.

In some embodiments, the first refractive index n1 of the red filter pattern 58 ranges from about 1.5 to about 1.8, the second refractive index n2 of the green filter pattern 60 ranges from about 1.6 to about 1.9, and the third refractive index n3 of the blue filter pattern 62 ranges from about 1.3 to about 1.8.

In this embodiment, the green filter pattern 60 contains the component and the mixture, and the specific refractive index is higher than the refractive index of the mixture, and the blue filter pattern 62 contains the component and the mixture, and the specific refractive index is lower than the refractive index of the mixture such that the second refractive index n2 of the green filter pattern 60 is higher than the first refractive index n1 of the red filter pattern 58 and the third refractive index n3 of the blue filter pattern 62. For example, the second refractive index n2 of the green filter pattern 60 is 1.7, the first refractive index n1 of the red filter pattern 58 is 1.5, and the third refractive index n3 of the blue filter pattern 62 is 1.5.

In some embodiments, the image-sensor structure 50 may further comprise a plurality of microlenses 64 formed above the color filter patterns 56.

Figure 3:
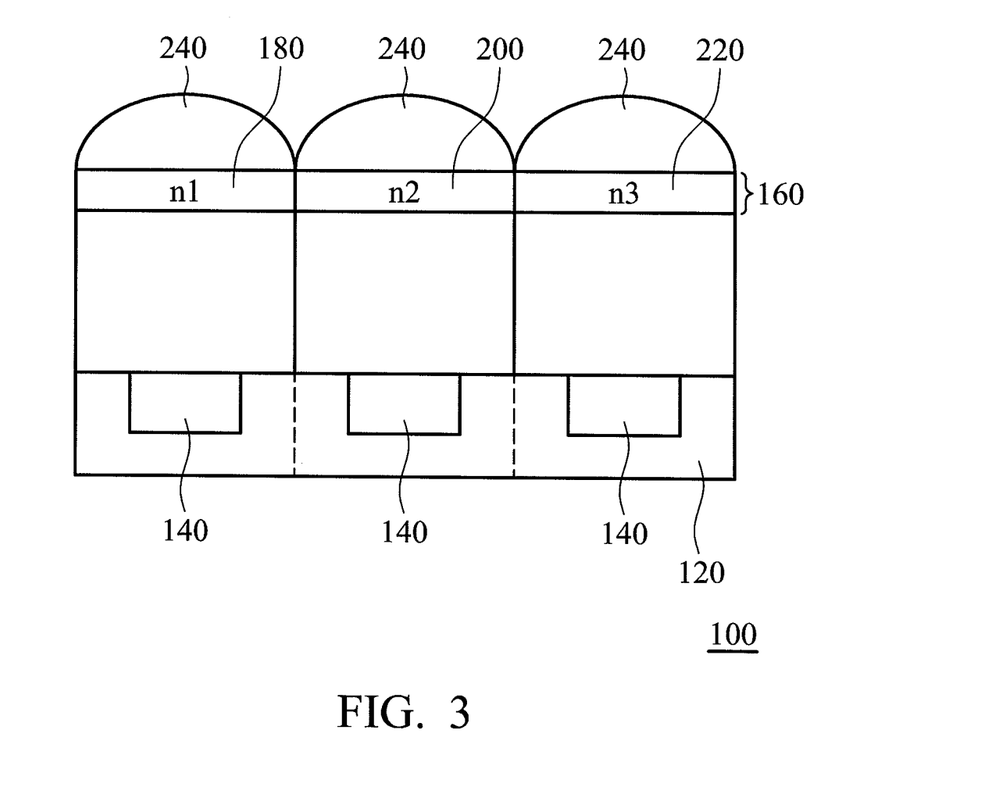
FIG. 3 is a cross-sectional view of an image-sensor structure in accordance with one embodiment of the invention.

An image-sensor structure according to one embodiment of the invention is described with reference to FIG. 3. FIG. 3 is a cross-sectional view of the image-sensor structure.

Referring to FIG. 3, an image-sensor structure 100 is provided. The image-sensor structure 100 comprises a substrate 120, a plurality of photoelectric conversion units 140 formed in the substrate 120, and a plurality of color filter patterns 160 comprising a red filter pattern 180 having a first refractive index n1, a green filter pattern 200 having a second refractive index n2 and a blue filter pattern 220 having a third refractive index n3 formed above the substrate 120 and the photoelectric conversion units 140. Specifically, a component having a specific refractive index has 1-10 wt % or 1-20 wt % based on the weight of at least one of the color filter patterns 160, for example, the red filter pattern 180, the green filter pattern 200 or the blue filter pattern 220 such that the second refractive index n2 of the green filter pattern 200 is higher than the first refractive index n1 of the red filter pattern 180 and the third refractive index n3 of the blue filter pattern 220.

In some embodiments, the photoelectric conversion unit 140 may comprise a photodiode (PD).

In some embodiments, each of the plurality of color filter patterns 160 may comprise at least one kind of pigments and compounds. The compounds may be one or more of dispersant, acrylic resin, sensitive polymer, etc. Mixtures of at least one kind of pigments and compounds are capable of producing consistent, compatible and predictable color effects. The color filter patterns 160 may be obtained from various combinations of pigment and compound to form the red filter pattern 180, the green filter pattern 200, and the blue filter pattern 220, respectively. Each of the mixtures has a refractive index based on its composition and proportion. The composition stands for various combinations of pigment and compound, and the proportion means proper ratio between pigment and compound.

In some embodiments, the component may comprise sulfur-containing polymers, silane-containing polymers, aromatic polyesters, polyimides, titanium oxide-containing polymers, or a combination thereof, having the specific refractive index higher than about 1.5.

In some embodiments, the component may comprise fluoroacrylic polymers, fluoroacrylic copolymers, or a combination thereof, having the specific refractive index lower than about 1.5.

In some embodiments, the first refractive index n1 of the red filter pattern 180 ranges from about 1.5 to about 1.8, the second refractive index n2 of the green filter pattern 200 ranges from about 1.6 to about 1.9, and the third refractive index n3 of the blue filter pattern 220 ranges from about 1.3 to about 1.8.

In this embodiment, the green filter pattern 200 contains the component and the mixture, and the specific refractive index is higher than the refractive index of the mixture, the red filter pattern 180 contains the component and the mixture, and the specific refractive index is higher than the refractive index of the mixture, and the blue filter pattern 220 contains the component and the mixture, and the specific refractive index is lower than the refractive index of the mixture such that the second refractive index n2 of the green filter pattern 200 is higher than the first refractive index n1 of the red filter pattern 180 and the third refractive index n3 of the blue filter pattern 220. For example, the second refractive index n2 of the green filter pattern 200 is 1.8, the first refractive index n1 of the red filter pattern 180 is 1.7, and the third refractive index n3 of the blue filter pattern 220 is 1.5.

In some embodiments, the image-sensor structure 100 may further comprise a plurality of microlenses 240 formed above the color filter patterns 160.

Figure 4:
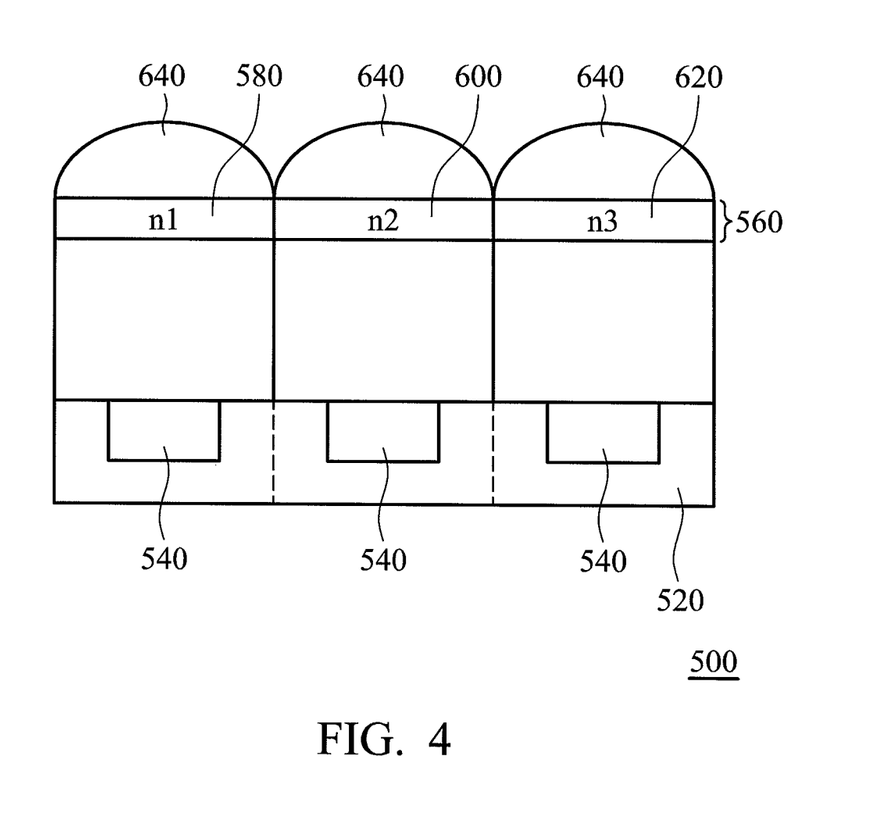
FIG. 4 is a cross-sectional view of an image-sensor structure in accordance with one embodiment of the invention.

An image-sensor structure according to one embodiment of the invention is described with reference to FIG. 4. FIG. 4 is a cross-sectional view of the image-sensor structure.

Referring to FIG. 4, an image-sensor structure 500 is provided. The image-sensor structure 500 comprises a substrate 520, a plurality of photoelectric conversion units 540 formed in the substrate 520, and a plurality of color filter patterns 560 comprising a red filter pattern 580 having a first refractive index n1, a green filter pattern 600 having a second refractive index n2 and a blue filter pattern 620 having a third refractive index n3 formed above the substrate 520 and the photoelectric conversion units 540. Specifically, a component having a specific refractive index has 1-10 wt % or 1-20 wt % based on the weight of at least one of the color filter patterns 560, for example, the red filter pattern 580, the green filter pattern 600 or the blue filter pattern 620 such that the second refractive index n2 of the green filter pattern 600 is higher than the first refractive index n1 of the red filter pattern 580 and the third refractive index n3 of the blue filter pattern 620.

In some embodiments, the photoelectric conversion unit 540 may comprise a photodiode (PD).

In some embodiments, each of the plurality of color filter patterns 560 may comprise at least one kind of pigments and compounds. The compounds may be one or more of dispersant, acrylic resin, sensitive polymer, etc. Mixtures of at least one kind of pigments and compounds are capable of producing consistent, compatible and predictable color effects. The color filter patterns 560 may be obtained from various combinations of pigment and compound to form the red filter pattern 580, the green filter pattern 600, and the blue filter pattern 620, respectively. Each of the mixtures has a refractive index based on its composition and proportion. The composition stands for various combinations of pigment and compound, and the proportion means proper ratio between pigment and compound.

In some embodiments, the component may comprise sulfur-containing polymers, silane-containing polymers, aromatic polyesters, polyimides, titanium oxide-containing polymers, or a combination thereof, having the specific refractive index higher than about 1.5.

In some embodiments, the component may comprise fluoroacrylic polymers, fluoroacrylic copolymers, or a combination thereof, having the specific refractive index lower than about 1.5.

In some embodiments, the first refractive index n1 of the red filter pattern 580 ranges from about 1.5 to about 1.8, the second refractive index n2 of the green filter pattern 600 ranges from about 1.6 to about 1.9, and the third refractive index n3 of the blue filter pattern 620 ranges from about 1.3 to about 1.8.

In this embodiment, the green filter pattern 600 contains the component and the mixture, and the specific refractive index is higher than the refractive index of the mixture such that the second refractive index n2 of the green filter pattern 600 is higher than the first refractive index n1 of the red filter pattern 580 and the third refractive index n3 of the blue filter pattern 620. For example, the second refractive index n2 of the green filter pattern 600 is 1.9, the first refractive index n1 of the red filter pattern 580 is 1.5, and the third refractive index n3 of the blue filter pattern 620 is 1.8.

In some embodiments, the image-sensor structure 500 may further comprise a plurality of microlenses 640 formed above the color filter patterns 560.

Figure 5:
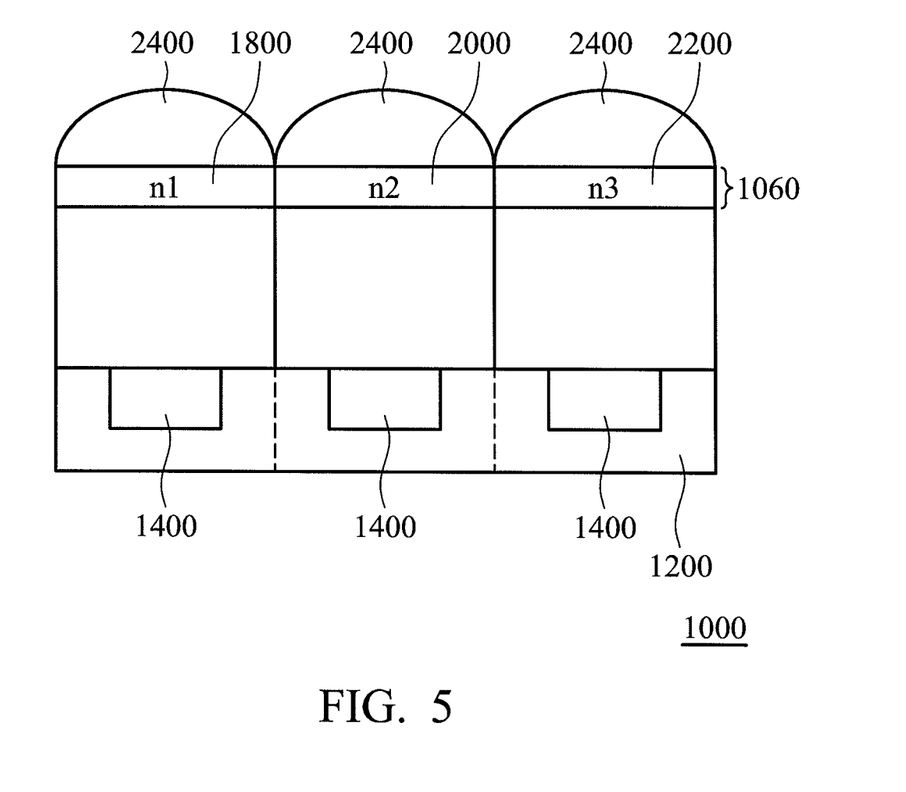
FIG. 5 is a cross-sectional view of an image-sensor structure in accordance with one embodiment of the invention.

An image-sensor structure according to one embodiment of the invention is described with reference to FIG. 5. FIG. 5 is a cross-sectional view of the image-sensor structure.

Referring to FIG. 5, an image-sensor structure 1000 is provided. The image-sensor structure 1000 comprises a substrate 1200, a plurality of photoelectric conversion units 1400 formed in the substrate 1200, and a plurality of color filter patterns 1600 comprising a red filter pattern 1800 having a first refractive index n1, a green filter pattern 2000 having a second refractive index n2 and a blue filter pattern 2200 having a third refractive index n3 formed above the substrate 1200 and the photoelectric conversion units 1400. Specifically, a component having a specific refractive index has 1-10 wt % or 1-20 wt % based on the weight of at least one of the color filter patterns 1600, for example, the red filter pattern 1800, the green filter pattern 2000 or the blue filter pattern 2200 such that the second refractive index n2 of the green filter pattern 2000 is higher than the first refractive index n1 of the red filter pattern 1800 and the third refractive index n3 of the blue filter pattern 2200.

In some embodiments, the photoelectric conversion unit 1400 may comprise a photodiode (PD).

In some embodiments, each of the plurality of color filter patterns 1600 may comprise at least one kind of pigments and compounds. The compounds may be one or more of dispersant, acrylic resin, sensitive polymer, etc. Mixtures of at least one kind of pigments and compounds are capable of producing consistent, compatible and predictable color effects. The color filter patterns 1600 may be obtained from various combinations of pigment and compound to form the red filter pattern 1800, the green filter pattern 2000, and the blue filter pattern 2200, respectively. Each of the mixtures has a refractive index based on its composition and proportion. The composition stands for various combinations of pigment and compound, and the proportion means proper ratio between pigment and compound.

In some embodiments, the component may comprise sulfur-containing polymers, silane-containing polymers, aromatic polyesters, polyimides, titanium oxide-containing polymers, or a combination thereof, having the specific refractive index higher than about 1.5.

In some embodiments, the component may comprise fluoroacrylic polymers, fluoroacrylic copolymers, or a combination thereof, having the specific refractive index lower than about 1.5.

In some embodiments, the first refractive index n1 of the red filter pattern 1800 ranges from about 1.5 to about 1.8, the second refractive index n2 of the green filter pattern 2000 ranges from about 1.6 to about 1.9, and the third refractive index n3 of the blue filter pattern 2200 ranges from about 1.3 to about 1.8.

In this embodiment, the green filter pattern 2000 contains the component and the mixture, and the specific refractive index is higher than the refractive index of the mixture, and the red filter pattern 1800 contains the component and the mixture, and the specific refractive index is higher than the refractive index of the mixture such that the second refractive index n2 of the green filter pattern 2000 is higher than the first refractive index n1 of the red filter pattern 1800 and the third refractive index n3 of the blue filter pattern 2200. For example, the second refractive index n2 of the green filter pattern 2000 is 1.9, the first refractive index n1 of the red filter pattern 1800 is 1.8, and the third refractive index n3 of the blue filter pattern 2200 is 1.8.

In some embodiments, the image-sensor structure 1000 may further comprise a plurality of microlenses 2400 formed above the color filter patterns 1600.

The invention adopts a color filter material, for example, a pigment, an acrylic resin or a sensitive polymer, blended with a high-refractive-index component, for example, sulfur-containing polymers, silane-containing polymers, aromatic polyesters, polyimides, titanium oxide-containing polymers, or a combination thereof, or a low-refractive-index component, for example, fluoroacrylic polymers, fluoroacrylic copolymers, or a combination thereof, to adjust the refractive index of the color filters such that the refractive index of the green filter is higher than the refractive index of the red filter and the refractive index of the blue filter. The SNR (signal-to-noise ratio) or quantum efficiency (QE) of the image-sensor structure with the color filters having various refractive indexes can thus be improved to achieve optimal device performance due to the green filter having the highest refractive index among the color filters which can increase the sensitivity of the green filter.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An image-sensor structure, comprising:
a substrate;
a plurality of photoelectric conversion units formed in the substrate; and
a plurality of single layer color filter patterns comprising a red filter pattern having a first refractive index, a green filter pattern having a second refractive index and a blue filter pattern having a third refractive index formed above the substrate and the photoelectric conversion units,
wherein at least one of the color filter patterns contains a single component having a specific refractive index such that the second refractive index of the green filter pattern is higher than the first refractive index of the red filter pattern and the third refractive index of the blue filter pattern,
wherein each of the color filter patterns comprise a mixture of at least one kind of pigment and at least one compound, and wherein the amount of the single component in each of the color filter patterns is based on the weight of the mixture in the red filter pattern, the green filter pattern or the blue filter pattern.

2. The image-sensor structure as claimed in claim 1, wherein the photoelectric conversion unit comprises a photodiode.

3. The image-sensor structure as claimed in claim 1, wherein the at least one compound includes at least one of a dispersant, acrylic resin, or sensitive polymer.

4. The image-sensor structure as claimed in claim 1, wherein the single component comprises sulfur-containing polymers, silane-containing polymers, aromatic polyesters, polyimides, titanium oxide-containing polymers, or a combination thereof.

5. The image-sensor structure as claimed in claim 4, wherein the single component has the specific refractive index higher than 1.5.

6. The image-sensor structure as claimed in claim 1, wherein the single component comprises fluoroacrylic polymers, fluoroacrylic copolymers, or a combination thereof.

7. The image-sensor structure as claimed in claim 6, wherein the single component has the specific refractive index lower than 1.5.

8. The image-sensor structure as claimed in claim 1, wherein the single component has 1-20 wt % based on the weight of the red filter pattern, the green filter pattern or the blue filter pattern.

9. The image-sensor structure as claimed in claim 3, wherein the blue filter pattern contains the single component and the mixture, and the specific refractive index is lower than the refractive index of the mixture.

10. The image-sensor structure as claimed in claim 3, wherein the green filter pattern contains the single component and the mixture, and the specific refractive index is higher than the refractive index of the mixture, and the blue filter pattern contains the single component and the mixture, and the specific refractive index is lower than the refractive index of the mixture.

11. The image-sensor structure as claimed in claim 3, wherein the green filter pattern contains the single component and the mixture, and the specific refractive index is higher than the refractive index of the mixture, the red filter pattern contains the single component and the mixture, and the specific refractive index is higher than the refractive index of the mixture, and the blue filter pattern contains the single component and the mixture, and the specific refractive index is lower than the refractive index of the mixture.

12. The image-sensor structure as claimed in claim 3, wherein the green filter pattern contains the single component and the mixture, and the specific refractive index is higher than the refractive index of the mixture.

13. The image-sensor structure as claimed in claim 3, wherein the green filter pattern contains the single component and the mixture, and the specific refractive index is higher than the refractive index of the mixture, and the red filter pattern contains the single component and the mixture, and the specific refractive index is higher than the refractive index of the mixture.

14. The image-sensor structure as claimed in claim 1, wherein the first refractive index of the red filter pattern ranges from 1.5 to 1.8, the second refractive index of the green filter pattern ranges from 1.6 to 1.9, and the third refractive index of the blue filter pattern ranges from 1.3 to 1.8.

15. The image-sensor structure as claimed in claim 1, further comprising a plurality of microlenses formed above the color filter patterns.

* * * * *